BROAD BAND TRANSISTOR AMPLIFIER

Filed Dec. 28, 1956 4 Sheets-Sheet 1

INVENTOR.
WILLIS L. LEE.
BY
Walter J. Jason
ATTORNEY.

June 21, 1960 W. L. LEE 2,942,199

BROAD BAND TRANSISTOR AMPLIFIER

Filed Dec. 28, 1956 4 Sheets-Sheet 2

INVENTOR.
WILLIS L. LEE

BY

ATTORNEY.

June 21, 1960 W. L. LEE 2,942,199

BROAD BAND TRANSISTOR AMPLIFIER

Filed Dec. 28, 1956 4 Sheets-Sheet 3

INVENTOR.
WILLIS L. LEE

BY
Walter J. Jason
ATTORNEY.

June 21, 1960 W. L. LEE 2,942,199

BROAD BAND TRANSISTOR AMPLIFIER

Filed Dec. 28, 1956

4 Sheets-Sheet 4

INVENTOR.
WILLIS L. LEE

BY

ATTORNEY.

United States Patent Office 2,942,199

Patented June 21, 1960

2,942,199

BROAD BAND TRANSISTOR AMPLIFIER

Willis L. Lee, San Diego, Calif., assignor to General Dynamics Corporation, San Diego, Calif., a corporation of Delaware Filed Dec. 28, 1956, Ser. No. 631,125

3 Claims. (Cl. 330—17)

This invention relates to broad band transistor amplifiers and more particularly to transistor amplifiers having a flat frequency response over a very broad frequency band width.

Using delay lines in broad band width application the signal is attenuated only slightly. This attenuation however increases with frequency. After a three db attenuation the higher frequencies are considered attenuated too much for most usage and the delay line is unsatisfactory for these frequencies. In delay lines the delay is approximately the same for all frequencies up to its cutoff frequency (defined as frequency of 3 db attenuation) and the capacitances within the delay line are not additive, so that any reasonable number of delay line sections may be used with the same effect. Broad band delay line amplifiers heretofore have been made with tubes using delay lines in the plate and grid circuits. In transistor high frequency application some flat response may be accomplished by loading down the tank circuit with a suitable resistor. A better transistor broad band response has been accomplished by combining this tank loading with staggered tuning techniques in which several coils are used all tuned to different frequencies. In staggered tuning the phase characteristics are not always flat and time lag (or phase shift) and overshoot problems are presented. A transistorized broad band amplifier has been developed using this staggered tuning principle. This amplifier has a 9.5 megacycle band width with a 30 megacycle center frequency.

The transistorized broad band amplifier comprising the present invention uses a plurality of signal paths, each carrying signals within a predetermined band width. These signal paths have uniform delay and attenuation, or amplification, so that all signals, regardless of frequency, appear in the output with the same delay and of constant magnitude to present a flat broad band frequency response curve from D.C. to its upper frequency response level.

An object of this invention is to provide for a novel broad band transistor amplifier.

Another object is to provide for a broad band transistor amplifier embodying delay line and uniform attenuation principles.

Another object is the provision of a broad band transistor amplifier capable of D.C. operation.

Another object is the provision of a broad band transistorized amplifier having a flat frequency response from D.C. to its upper frequency operational level.

Another object is the provision of a broad band transistor amplifier wherein transistors are connected in parallel paths between spaced points on a pair of delay lines.

Still another object is the provision of a transistorized delay line broad band amplifier wherein the parallel paths have equal attenuation or amplification.

Still another object is the provision of a transistorized delay line broad band amplifier wherein the delay time of signals through any of the various parallel paths is equal.

Other objects and features of the present invention will be readily apparent to those skilled in the art from the following specification and appended drawings wherein is illustrated a preferred form of the invention, and in which.

Figure 1:
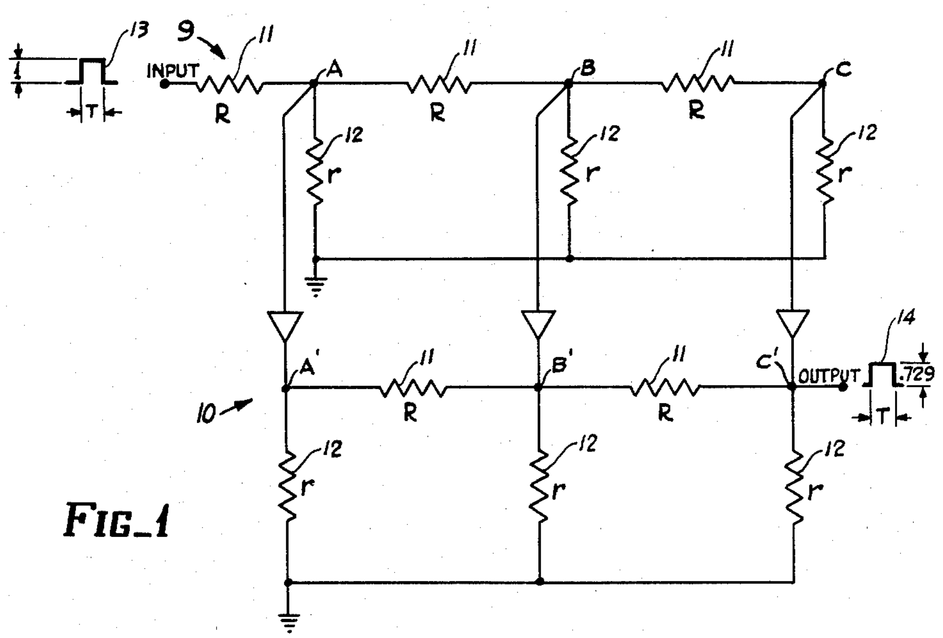
Figure 1 is a schematic of an attenuation network wherein all signal paths have equal attenuation.

Now reference is made to Figure 1 which shows the novelty of an attenuation pattern which indicates no matter which path is taken between the "in" line 9 and the "out" line 10 the attenuation or the gain will always be the same. Here is shown lines of pure resistance with resistances 11(R) in the series legs and 12($r$) in the parallel legs. In the "in" resistor line 9, we now put a square wave 13 of amplitude 1 and of length T to the input. With no inductance or capacitance delay time is not considered. At point A there is an attenuation of a ratio $$\frac{r}{r+R}$$

Figure 2:
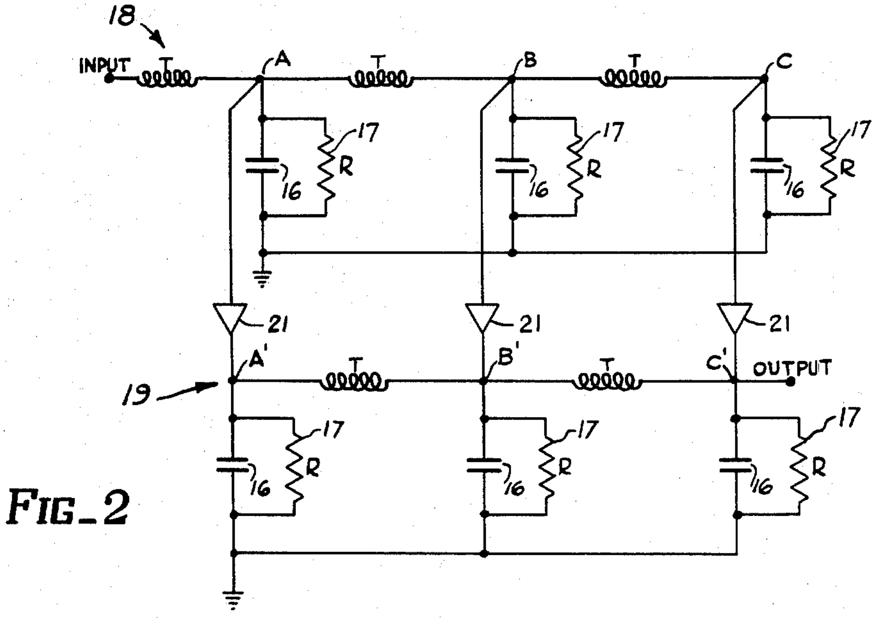
Figure 2 is a schematic of a combined broad band delay line and attenuation network wherein the signal paths have constant delay and attenuation.

Assume R is one ohm and $r$ is 9 ohms. Thus the signal 13 having a unit value of 1 would have a value of .9 at point A. The attenuation in each successive section is also .9 of the signal received. Therefore, the value of the signal at point B is .81. At point C the signal is further attenuated to a value of .9 times .81 or .729. The ratios of the resistances in the output line is the same as the ratio of the resistances in the input line although not necessarily of the same identical values. Now consider the connection of points A to A′, B to B′, and C to C′. A signal coming from A to A′ has already had its attenuation to .9. The value at B′ is .81 and the value at C′ is .729. Similarly, a signal coming from B to B′ to C′ or from C to C′ has a value of .729. Regardless of which path the signal travels from the "in" line 9 to the "out" line 10 the signal 14 in the output is always of the same amplitude. This line is not a no-loss line as used in conventional delay line application but is in fact an attenuating line. Since this line is a line of attenuation and not a delay line in time it is unique in this line theory. Now combine this type line with the conventional time delay line. This may be done, as shown in Figure 2, by bypassing the capacitances 16 with a resistor 17 to ground. Here the delay paths and attenuation paths are of constant values. The input delay line 18 shows a delay T to point A, a delay of T between points A and B and T delay between points B and C. There is now a total of 3 T delay at point C. Over each section there is a certain amount of attenuation depending upon the reactance, the inductance, and the value of the resistance within the circuit. The "out" delay line 19 is connected with the "in" delay line 18 in the same manner as in Figure 1, i.e., points A to A′, B to B′ and C to C′. The requirement of this invention is that the attenuation in each of the signal paths be the same. This requirement is in addition to that of a normal distributed delay line where the delay in each path is the same. With the attenuation the same and the delay time the same, all signals coming into point C′ are superimposed in time and of the same attenuated value. To insure some amplification within each of the paths between A, A′; B, B′; and C, C′ amplifying means 21, for example a tube, is inserted. The signal paths are now traced from the standpoint of delay. From point "in" to point A across to point A′ and then down the second line 19 there is a 3T delay. Now if the signal goes to point B, to B′ and then C′, there is still a 3T delay. If the signal goes to point C in the first delay line 18 and down to C′ the delay time is still 3T. Thus the first requirement is met, that all the pulses will line up simultaneously with respect to time. The second requirement to be met is attenuation. Attenuation at point A is to an index value of .9, at B .81, and at C .72. The attenuation between A′ and B′ is also to an index value of .9, as well as from B′ to C′. Therefore the signal from "in" going to A is attenuated to .9. Then if it passes down to A′ it is attenuated to .81 at B′ and to .72 at C′. The signal going to point B is attenuated to a value of .81 and from B′ to C′ by a factor of .9 for an attenuation of total value of .72 at C′. A signal traveling to point C and then to point C′ also has a value of .72. Thus we see that no matter which line the signal travels between the delay line 18 and the "out" delay line 19 the attenuation is always the same. This gives us a broad band of flat response, all frequencies being attenuated to the same level within the limits of the amplifier. It should be noted that this amplifier does not require a no-loss delay line but will accept losses in each of the paths of a constant level. Now suppose that the vacuum tube amplifier 21 across each path between the delay lines has an amplification factor of K1 and the signal is attenuated by factor L between the sections. The total gain or loss K2 of the line is determined by multiplying L times K1. Therefore it is possible that the delay line not have an attenuation but an amplification, which may be the desirable factor in most applications.

Figure 3:
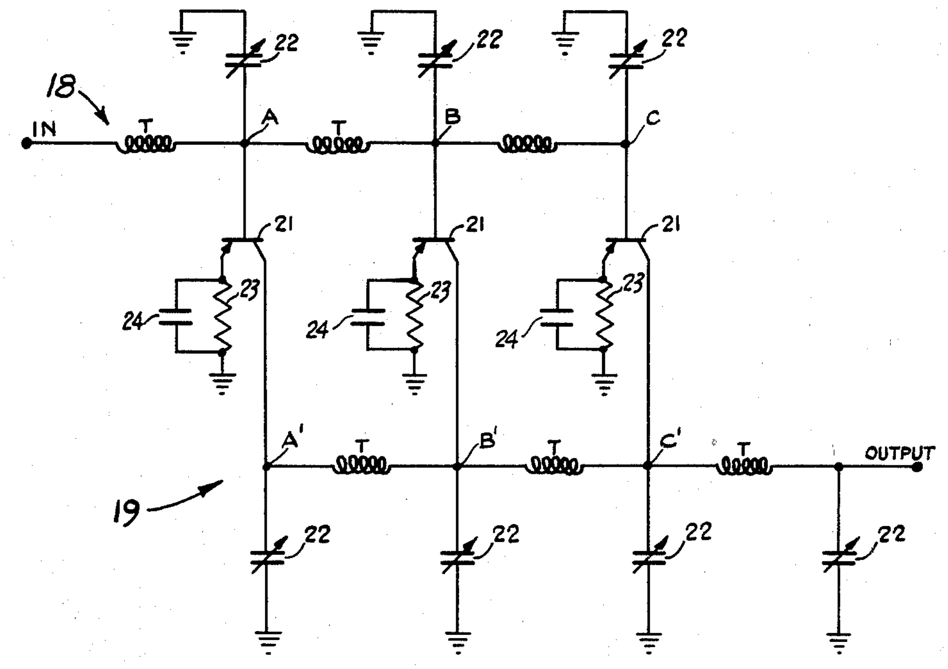
Figure 3 is a simplified schematic wherein transistors have been added to the circuit.

Figure 3 shows the transistor amplifiers 21 in circuit. These transistors offer an impedance of approximately 60 ohms between the delay line sections. In the use of vacuum tubes across the line the problem of loading was not presented. However with transistors this impedance represents a true resistance across the delay line which is not in keeping with the accepted theory that delay lines must be "no-loss." However under the principles of this invention the use of a delay line with attenuation or loss is accepted and therefore a 60 ohm input resistance of the transistors between the sections is permissible, since it becomes the shunt resistance as previously explained.

The transistor 21 itself also represents part of the input capacitance or maybe all of it. Actually a little trimmer capacity 22 is added because all transistors do not have the same capacitance and it is desired to make the capacitance across all sections equal. The attenuation may also be controlled with a resistor 23 in series in the emitter circuit of each transistor. In tracing the circuit in Figure 3 as in other circuits it is seen that no matter which path the signal takes between the two delay lines the attenuation is the same and also the time delay is the same, with the transistors forming isolation amplifiers 21 between the delay lines 18 and 19. One of the unique features of this invention is in the use of the transistors between the delay lines. Formerly the concept was that there could be no attenuation in the delay line and a distributed type amplifier required a no-loss delay line. With an attenuation across each section due to the transistor, designated as L and the amplification of the transistor, K1, the product of the two gives the value K2 of the output, whether it be an attenuation or an amplification. Figure 3 shows a simplified one stage amplifier of this type. An increase in the frequency band width may be accomplished by adding a reasonable number of sections to the line. The amplifier just described is capable of a range of from between D.C. to 100 megacycles with existing transistors and a proper number of line sections.

Figure 4:
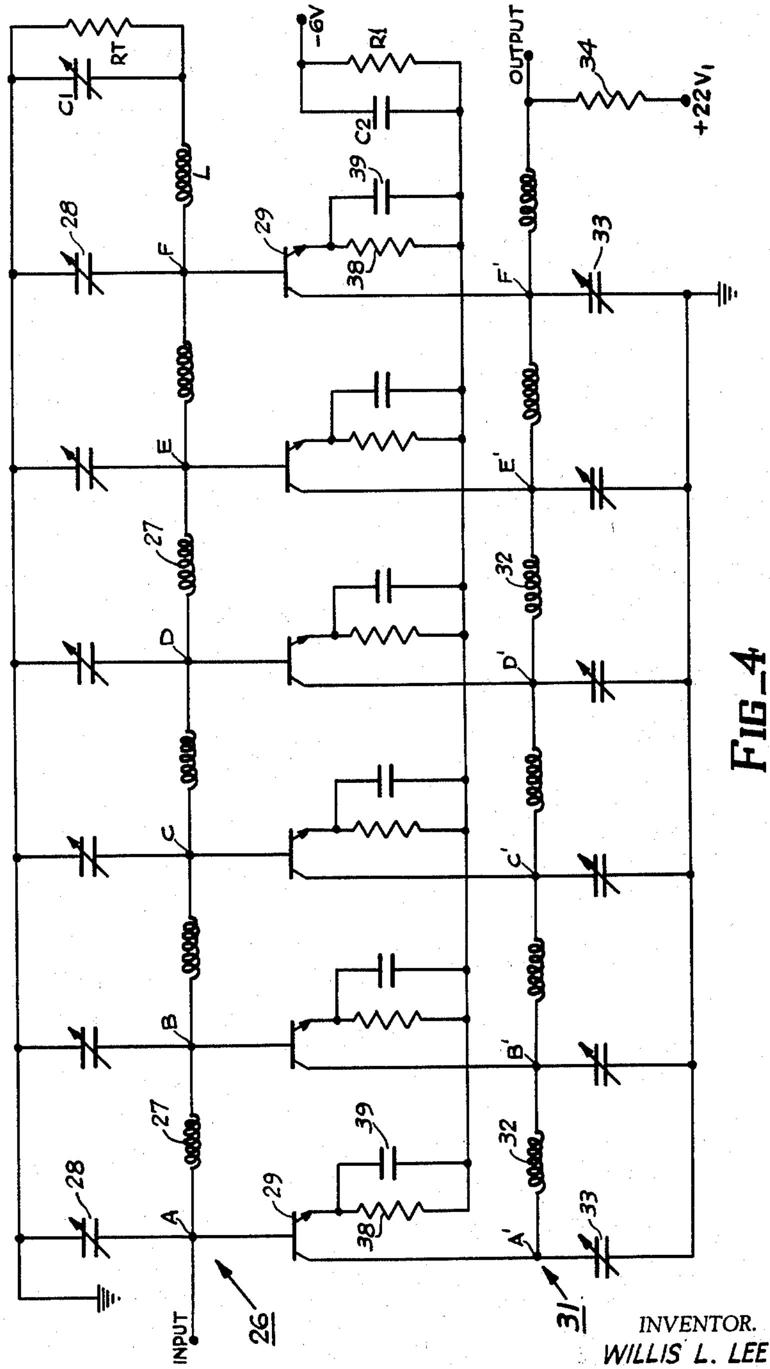
Figure 4 shows a typical broad band transistor circuit.

Figure 4 is a schematic of a typical A.C. transistorized broad band amplifier utilizing the principles embraced in the present invention. This specific embodiment has a band width from 10 cycles to 12 megacycles with a 22 db voltage gain and a 14.6 db power gain. The input line has 0.35 microhenry inductance 27 per section and input capacitances 28 from 7 to 45 micro-micro-farads between the common points, A to F, and ground. These points are also connected to the bases of the individual transistors 29. Each transistor represents some input capacitance which is included as part of the delay line capacitance to ground. Actually, the natural impedance of the delay line is chosen to match the impedance of the transistors although this is not necessary. At the end of line 26 is the terminating resistance RT which prevents mismatch and reflection waves. The attenuation between the points in line 26 is constant and is equal to the attenuation in the output delay line 31 between its corresponding points. The impedances of the two lines do not have to be equal. In fact, the impedance of line 26 should match the impedance of the input circuit to be connected thereto and the impedance of line 31 should be equal to the desired output circuit to which it is to be connected. The inductances 32 between points A′ to F′ in line 31 are 9 microhenries and are grounded through 3 to 13 micro-micro-farad capacitors 33. The output line 31 is terminated in a 330 ohm load resistor 34 connected to a +22 volt supply source. The emitter circuit of the transistors 29 includes a 100 ohm resistor 38 and a 100 micro-micro-farad capacitor 39. These are for purposes of "cathode compensation" and assist to achieve a somewhat higher frequency.

When emitter resistor R1 in Figure 4 is used to supply the bias on the transistors 29 then this has to be bypassed by a filter capacitor C2. This means that there is some frequency near the D.C. at which the bypass condenser C2 is not operable or useful. Therefore there will be some attenuation near the D.C. and the response curve could not be flat to D.C. This is overcome by the use of the differential amplifier as shown in Figures 5 and 6 in which there are two inputs 41, 42 and two outputs 43, 44.

Figure 5:
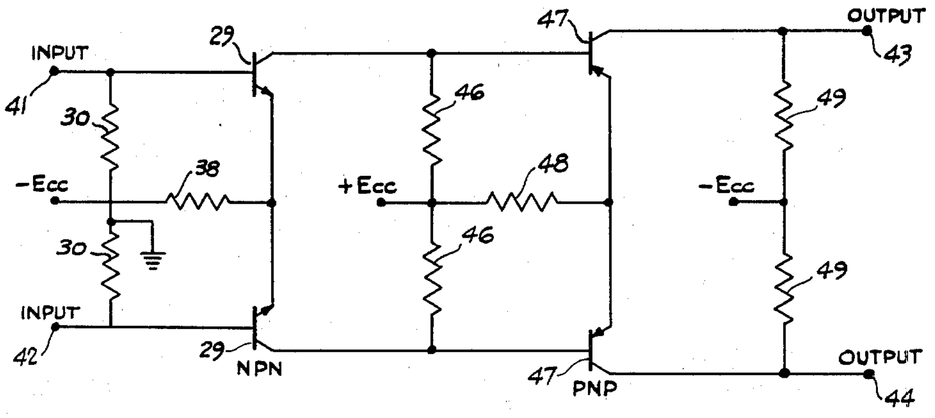
Figure 5 shows a simplified transistor amplifier having a bandwidth from D.C. to its upper frequency operating level.

Figure 5 is a two stage differential amplifier using NPN transistors in the first stage and PNP transistors in the second stage. There are two input terminals 41, 42 which receive differential signals from a preceding circuit, not shown. These terminals are connected to the bases of the two NPN transistors 29. The bases are connected together through resistors 30 for biasing purposes. These resistors are grounded at their midpoint and correspond to the input resistors of a conventional tube amplifier. The emitters of transistors 29 are connected together and through a resistor 38 to the minus power supply, −Ecc. Due to the fact that these transistors are being driven 180° out of phase the current through resistor 38 will be a constant value which will place the point of the emitters at a steady state D.C. level. Therefore, there needs to be no bypassing of any kind across resistor 38, which is common to both transistors, regardless of the type of signal being amplified. Resistors 46 are connected to each collector of the transistors 29, and the base of the following PNP transistor 47. They are connected together and to the plus power supply, +Ecc. The +Ecc and −Ecc are actually plus and minus voltages with respect to ground. The emitters of the PNP transistors 47 are connected together and to the +Ecc voltage source which furnishes the necessary D.C. bias through emitter resistor 48. Because resistor 48 is common to both transistors it requires no bypassing. It should be noted that the collectors of transistors 29 are directly coupled to the bases of transistors 47. The signal is taken across resistor 46 and the power supply impedance does not have any effect upon the coupling circuit. The collector circuits are connected through load resistors 49 to the minus power supply, $-E_{cc}$.

Figure 6:
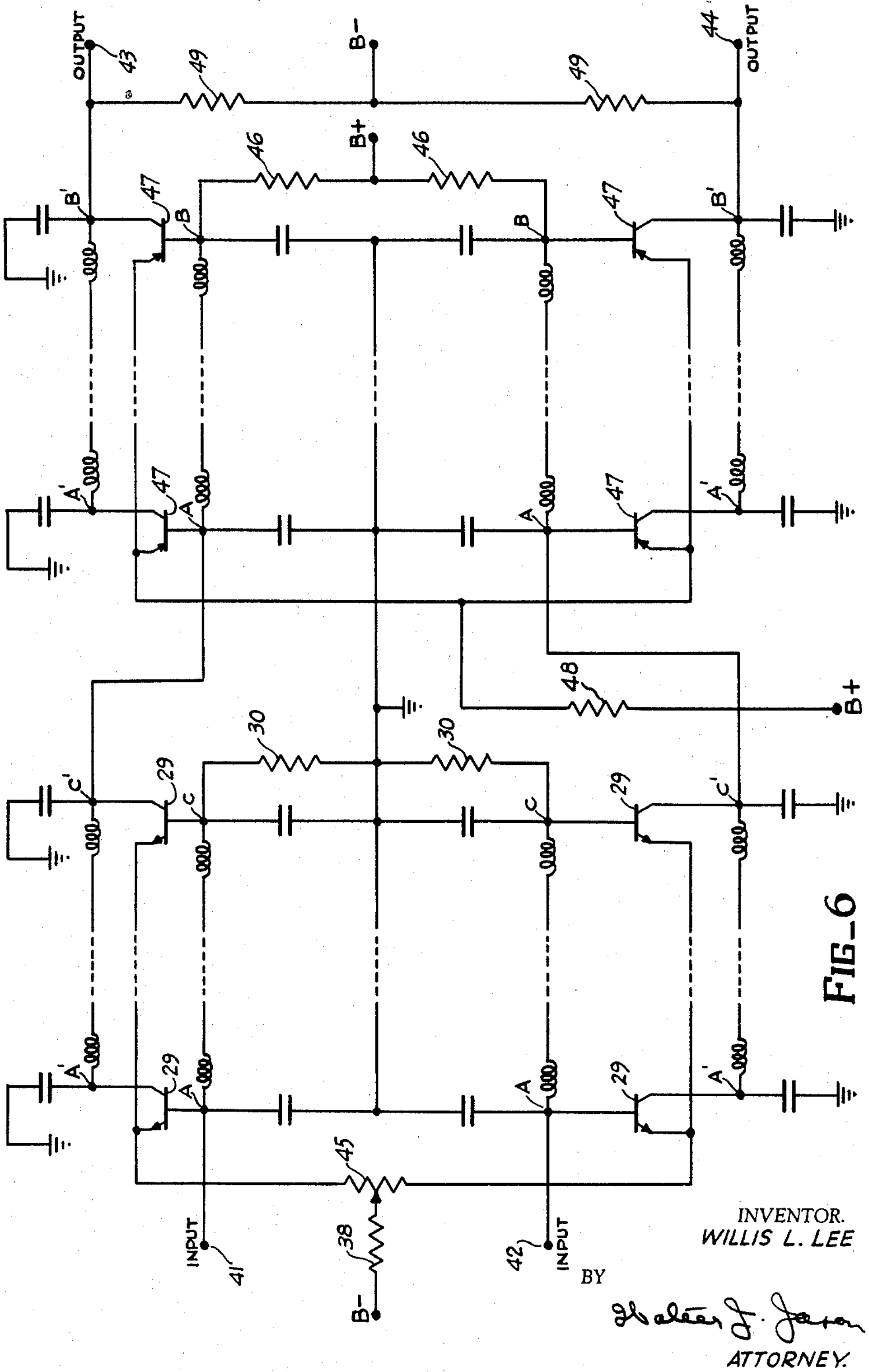
Figure 6 shows a typical differential input two stage transistorized amplifier having a band width from D.C. to its upper frequency operating level.

This circuit in Figure 5 is a simplified version of the circuit shown in Figure 6 which is a D.C. to high frequency distributed transistorized amplifier with a differential input. Here the emitters of transistors 29 are tied to a common point and connected to a single resistor 38. The signal balances out across the resistor 38 so that there is no attenuation. The potentiometer 45 is for D.C. balance. This amplifier stage has characteristics of from D.C. to the frequency it had before. Since there are no bypass capacitors, the only requirement is that both collector lines must be designed the same and the base lines must be designed the same in delay characteristics and attenuation characteristics. This does not mean, however, that the impedance must be the same in both lines. This does mean that the delay time and the loss must be the same in each line. Once this condition exists, instead of coupling with a condenser to the next stage it may be coupled directly to the next stage in which opposite type transistors are used. This is something that couldn't be done with tubes because tubes do not have opposite characteristics as does the PNP transistor as it differs from the NPN transistor. Hence by going from NPN to the PNP type, or vice versa, the two stages may be tied directly together. The principles are the same with each type of transistor with respect to delay line usage. The difference between Figure 5 and Figure 6 is that instead of one transistor NPN in Figure 5 being a single transistor, it represents several sections of a delay line or a distributed amplifier as in Figure 6. The PNP transistors 47 in Figure 5 also represent a section made up of several delay line sections. Figure 5 is merely a simplified schematic used to explain the multiple stage operation of Figure 6, and since like components are designated with like numerals, further explanation is not thought to be necessary.

To summarize, an amplifier of from D.C. to 42 megacycles or greater band width if desired has been built with transistors. A.C. operation of any range may easily be achieved by using only single end operation (not differential). From a desired low frequency such as 10 cycles, to the upper limit such as 100 megacycles or higher is easily accomplished by the use of condenser coupling between stages and single ended operation. The circuitry thus designed permits the use of a low-loss line across each section and the only requirement is that the various signal paths in the delay lines require the same attenuation and same delay time in each path. Also for the D.C. operation of multiple stages the unique feature is the use of differential and circuit symmetry going from the NPN to the PNP transistor, or the reverse, and using the features of a differential amplifier and the transistor symmetry connections. It should be noted that these principles are not applicable solely for the type of delay line shown but may work for any of the several types of delay lines. The line should be designed to the best advantage so that a load of the input transistor is going to be equal to the equation $$R=\sqrt{\frac{L}{C}}$$

so that the natural impedance of the delay line is equal to the natural impedance of the transistor, or for the optimum conditions of the particular circuit.

Many applications of this broad band amplifier are possible. One of the fields may be covered completely by saying this transistor amplifier is a low signal amplifier due to the fact that these transistors at present will deliver at most about one volt to maybe 10 volts, which is limited at present only by the available transistors. This amplifier will take the place of any amplifier of the tube variety within present transistor limitation. This covers in the nuclear field all the pulse work, all of the distributed amplifiers that are used to boost up the signals in telephone operation, for coaxial cable boost, for television video amplifiers, and in counter techniques where broad band amplifiers are needed for laboratory type test equipment. Much similar to the tube distributed amplifiers now on the market it can be used in a lightweight oscilloscope and that the total power used in this amplifier is equal to less than the power used in the filament in only one single vacuum tube of a normal tube distributed amplifier.

While certain preferred embodiments of the invention have been specifically disclosed, it is understood that the invention is not limited thereto as many variations will be readily apparent to those skilled in the art and the invention is to be given its broadest possible interpretation within the terms of the following claims.

What I claim is:

1. A transistorized broad band amplifier with a differential input and differential output and having a band width range of D.C. to N frequency, where N is an upper predetermined frequency, said amplifier having an input stage comprising two sections each of which includes a plurality of band pass signal paths from the input thereto to the output thereof, each of said paths having a transistor therein with capacitance and resistance compensating means connected therewith, the emitters of the input stage transistors being connected to a common bias through a common resistance, the collectors of the transistors in each section being connected through signal delay means to form collector delay lines, the bases of the transistors in each section being connected through signal delay means to form base delay lines, said bases being connected to input signal sources, the collector delay lines of both sections having the same time delay and signal attenuation characteristics, the base delay lines of both sections also having the same time delay and signal attenuation characteristics, said amplifier having an output stage comprising two sections each of which includes a plurality of band pass signal paths from the input thereto to the output thereof, each of said output paths having a transistor therein with capacitance and resistance compensating means connected therewith, the collectors of the transistors in each section being connected through signal delay means to form collector delay lines, the bases of the transistors in each section being connected through signal delay means to form base delay lines, the collector delay lines of both output sections having the same time delay and signal attenuation characteristics, the collector lines of said input sections constituting the output of said input sections and each being connected to one of the base lines of an output section to form the input thereto, the collecor lines of said output sections constituting the output of said output stage whereby signal paths from one input stage section to one output stage section will have equal time delay and signal attenuation characteristics to the signal paths from the other input stage section to its corresponding output stage section to thus identically amplify the input signals to said differential input amplifier.

2. A transistorized broad band differential amplifier having a band width range of D.C. to N frequency, where N is an upper predetermined frequency, said amplifier having an input stage comprising two sections of signal paths from the inputs thereto to the outputs thereof, each of said sections having paths with transistor of one type therein, the bases of said transistors being connected through signal time delay means to input signal source, the emitters of said transistors being connected through a common resistance to a power supply of one polarity, the collectors of said transistors being connected through signal time delay means to an output stage, each of said paths having equal time delay characteristics, said transistors having compensating means therewith to equalize the capacitance and resistance in said paths to thereby provide said paths with equal amplification characteristics, each of said paths passing signals within selected band widths within the band width range of said amplifier, said amplifier having an output stage comprising two sections each having a plurality of signal paths from the output of said input stage to the output of said output stage, each of said output stage paths having a transistor therein of a second type, the bases of said transistors of a second type being connected through signal time delay means to the collectors of the input stage transistors forming the output of said input stage, the emitters of said output stage transistors being connected through a common resistance to a power supply of a second polarity, the collectors of said output stage transistors being connected as the output of said output stage, each of said output stage paths having equal time delay characteristics, both types of said transistors having compensating means therewith to equalize the capacitance and resistance in said paths to thereby provide said paths with equal amplification, each of said paths passing signals within selected band widths within the band width range of said emplifier.

3. A transistorized broad band amplifier with a differential input and differential output and having a band width range of D.C. to N frequency, where N is an upper predetermined frequency, said amplifier having an input stage comprising two sections each of which includes a plurality of band pass signal paths from the input thereto to the output thereof, each of said paths having a transistor therein with capacitance and resistance compensating means connected therewith, the emitters of the input stage transistors being connected to a common bias through a common resistance, the collectors of the transistors in each section being connected through signal delay means to form collector delay lines, the bases of the transistors in each section being connected through signal delay means to form base delay lines, said bases being connected to input signal sources, the collector delay lines of both sections having the same time delay and signal attenuation characteristics, the base delay lines of both sections also having the same time delay and signal attenuation characteristics, the collector lines of said input sections constituting the output of said input sections.

References Cited in the file of this patent

UNITED STATES PATENTS

| | | |
|---|---|---|
| 2,680,160 | Yaeger | June 1, 1954 |
| 2,691,075 | Schwartz | Oct. 5, 1954 |
| 2,727,100 | Hurvitz | Dec. 13, 1955 |
| 2,761,917 | Aronson | Sept. 4, 1956 |
| 2,762,874 | Barco | Sept. 11, 1956 |
| 2,778,888 | Bradley | Jan. 22, 1957 |

OTHER REFERENCES

Ginzton et al.: "Distributed Amplification," Proceedings of The IRE, vol. 36, No. 8, August 1948, pages 956–969.

Tyminski: "Wide-Band Chain Amplifier For TV," Radio and Television News, April 1950, Engineering Section, pages 14–17.